United States Patent
Sugizaki et al.

(10) Patent No.: US 8,759,863 B2
(45) Date of Patent: Jun. 24, 2014

(54) SEMICONDUCTOR LIGHT-EMITTING DEVICE AND METHOD FOR MANUFACTURING SAME

(71) Applicant: Kabushiki Kaisha Toshiba, Minato-ku (JP)

(72) Inventors: Yoshiaki Sugizaki, Kanagawa-ken (JP); Akihiro Kojima, Kanagawa-ken (JP); Susumu Obata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/706,527

(22) Filed: Dec. 6, 2012

(65) Prior Publication Data
US 2013/0092970 A1    Apr. 18, 2013

Related U.S. Application Data

(62) Division of application No. 12/710,829, filed on Feb. 23, 2010, now Pat. No. 8,350,285.

(30) Foreign Application Priority Data

Sep. 25, 2009    (JP) ................. 2009-220434

(51) Int. Cl.
H01L 33/00    (2010.01)
(52) U.S. Cl.
USPC .. 257/98; 257/99; 257/E33.061; 257/E33.067
(58) Field of Classification Search
USPC ................ 257/98–99, E33.061, E33.067
See application file for complete search history.

(56) References Cited

U.S. PATENT DOCUMENTS

| | | | |
|---|---|---|---|
| 5,952,681 A | 9/1999 | Chen | |
| 6,331,450 B1 | 12/2001 | Uemura | |
| 2002/0096994 A1 | 7/2002 | Iwafuchi et al. | |
| 2004/0115849 A1 | 6/2004 | Iwafuchi et al. | |
| 2005/0194605 A1 | 9/2005 | Shelton et al. | |
| 2006/0157721 A1 | 7/2006 | Tran et al. | |
| 2006/0261364 A1* | 11/2006 | Suehiro et al. | 257/100 |
| 2007/0069643 A1 | 3/2007 | Brunner et al. | |
| 2007/0087644 A1 | 4/2007 | Iwafuchi et al. | |
| 2009/0053856 A1 | 2/2009 | Ohsumi | |

(Continued)

FOREIGN PATENT DOCUMENTS

| | | |
|---|---|---|
| EP | 2 216 834 | 8/2010 |
| JP | 10-163536 | 6/1998 |

(Continued)

OTHER PUBLICATIONS

Japanese Office Action for Japanese Application No. 2009-220434 mailed on Jan. 24, 2012.

(Continued)

Primary Examiner — Elias M Ullah
(74) Attorney, Agent, or Firm — White & Case LLP

(57) ABSTRACT

A semiconductor light-emitting device of the invention includes: a semiconductor layer including a light-emitting layer and having a first major surface and a second major surface opposite to the first major surface; a phosphor layer facing to the first major surface; an interconnect layer provided on the second major surface side and including a conductor and an insulator; and a light-blocking member provided on a side surface of the semiconductor layer and being opaque to light emitted from the light-emitting layer.

18 Claims, 9 Drawing Sheets

(56) References Cited

U.S. PATENT DOCUMENTS

| | | |
|---|---|---|
| 2009/0103292 A1 | 4/2009 | Iwafuchi et al. |
| 2009/0294966 A1* | 12/2009 | Liu et al. ................. 257/746 |
| 2010/0052142 A1 | 3/2010 | Tojo et al. |

FOREIGN PATENT DOCUMENTS

| | | |
|---|---|---|
| JP | 11-150298 A | 6/1999 |
| JP | 2000-244012 | 9/2000 |
| JP | 2002-118293 | 4/2002 |
| JP | 2002-246648 | 8/2002 |
| JP | 2002261335 A | 9/2002 |
| JP | 2002-305328 | 10/2002 |
| JP | 200337286 | 2/2003 |
| JP | 2005-116998 | 4/2005 |
| JP | 2006035664 | 4/2006 |
| JP | 2006-128625 | 5/2006 |
| WO | 2009064330 | 5/2009 |
| WO | 2009069671 | 6/2009 |
| WO | 2010124915 | 11/2010 |

OTHER PUBLICATIONS

U.S. Office Action mailed on Feb. 13, 2012 corresponding to U.S. Appl. No. 12/710,729.

European Search Report for European Application No. 10154639.8-1226 dated May 26, 2012.

Japanese Office Action for Japanese Application No. 2009-220434 mailed on Oct. 2, 2012.

JP Office Action issued on Aug. 22, 2013 in corresponding JP Application No. 2012-263232, an English translation thereof.

Japanese Office Action for Japanese Patent Application No. 2009-220434 mailed on Apr. 9, 2013.

The Taiwanese Office Action issued on Nov. 13, 2012 in the counterpart Taiwanese patent application No. 099105669.

Japanese Office Action issued Feb. 14, 2014 received in corresponding JP Application No. 2012-263232, and an English translation thereof.

* cited by examiner

SEMICONDUCTOR LIGHT-EMITTING DEVICE AND METHOD FOR MANUFACTURING SAME

CROSS-REFERENCE TO RELATED APPLICATIONS

This application is a Divisional of application Ser. No. 12/710,829 filed Feb. 23, 2010; the entire contents of which are incorporated herein by reference.

This application is based upon and claims the benefit of priority from the prior Japanese Patent Application No. 2009-220434, filed on Sep. 25, 2009; the entire contents of which are incorporated herein by reference.

BACKGROUND

A wavelength-converting light-emitting diode, which a blue light-emitting element is combined with a phosphor to produce white light, is conventionally known. For instance, JP-A 2005-116998 (Kokai) mentions a manufacturing method in which a phosphor layer is formed on the upper surface of a wafer including numerous LEDs, and then the wafer is cut into individual chips. However, in this case, the light emitted from the side surface of the light-emitting element does not pass through the phosphor layer, and bluish light is emitted from the side surface. Thus, it is difficult to produce white light as desired.

SUMMARY

According to an aspect of the invention, there is provided a semiconductor light-emitting device including: a semiconductor layer including a light-emitting layer and having a first major surface and a second major surface opposite to the first major surface; a phosphor layer facing to the first major surface; an interconnect layer provided on the second major surface side and including a conductor and an insulator; and a light-blocking member provided on a side surface of the semiconductor layer and being opaque to light emitted from the light-emitting layer.

According to another aspect of the invention, there is provided a method for manufacturing a semiconductor light-emitting device, comprising: forming a semiconductor layer including a light-emitting layer on a major surface of a substrate; forming an trench dividing the semiconductor layer on the substrate into a plurality; forming an interconnect layer including a conductor and an insulator on a second major surface of the semiconductor layer, the second major surface being opposite to a first major surface in contact with the substrate; forming a light-blocking member on a side surface of the semiconductor layer exposed to the trench, the light-blocking member being opaque to light emitted from the light-emitting layer; and forming a phosphor layer on the first major surface of the semiconductor layer.

DETAILED DESCRIPTION

Embodiments of the invention will now be described with reference to the drawings.

Figure 1:
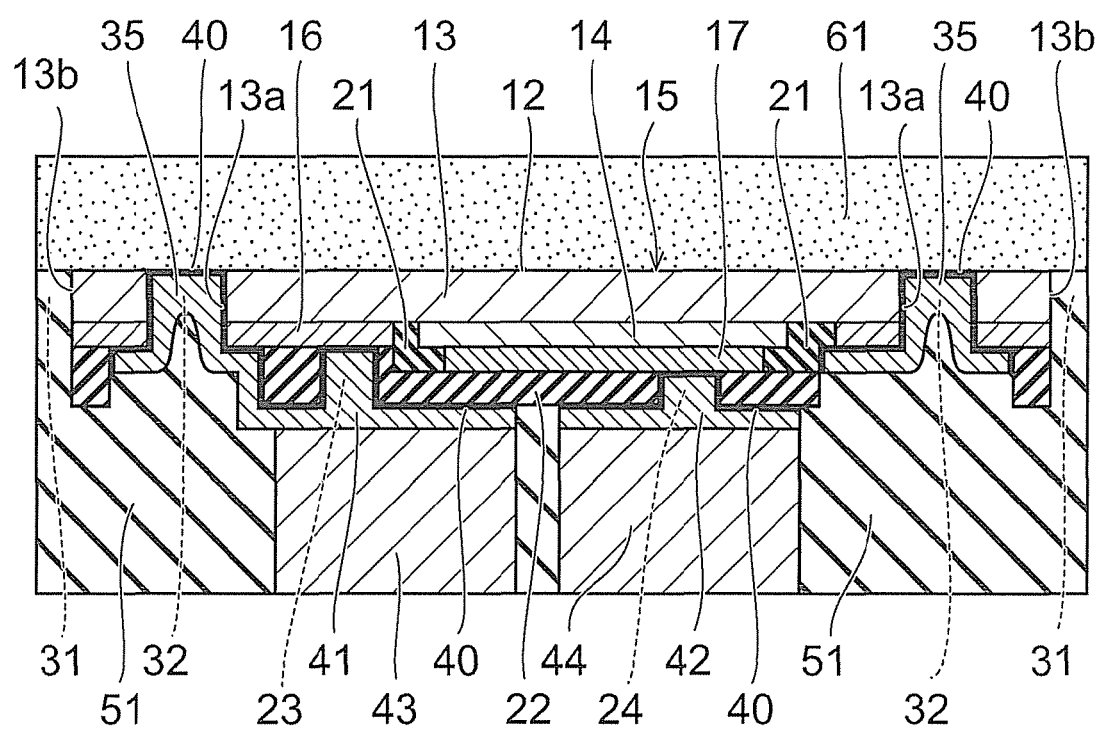
FIG. 1 is a schematic cross-sectional view of a semiconductor light-emitting device according to a first embodiment.

FIG. 1 is a schematic cross-sectional view of a semiconductor light-emitting device according to a first embodiment.

The semiconductor light-emitting device according to this embodiment includes a light-emitting element 15 and an interconnect layer, which are collectively formed in wafer state. The light-emitting element 15 includes a first semiconductor layer 13 and a second semiconductor layer 14. The second semiconductor layer 14 has a structure in which a light-emitting layer (or active layer) is sandwiched between a p-type cladding layer and an n-type cladding layer. The first semiconductor layer 13 is illustratively of n-type and functions as a lateral current path. However, the conductivity type of the first semiconductor layer 13 is not limited to n-type, but may be p-type.

The first major surface of the first semiconductor layer 13 functions as a light extraction surface 12. The second semiconductor layer 14 is selectively provided on the second major surface opposite to the light extraction surface 12. Hence, the planar size of the second semiconductor layer 14 is smaller than that of the first semiconductor layer 13.

An n-side electrode 16 is provided on a portion of the second major surface of the first semiconductor layer 13 where the second semiconductor layer 14 is not provided. A p-side electrode 17 is provided on the surface of the second semiconductor layer 14 opposite to its surface in contact with the first semiconductor layer 13.

An insulating film 21 is interposed between the end portion of the n-side electrode 16 and the end portion of the p-side electrode 17. Furthermore, the surface of the n-side electrode 16 and the p-side electrode 17 is covered with an insulating film 22. For instance, the insulating film 21 is made of silicon oxide, and the insulating film 22 is made of polyimide. Silicon oxide has higher insulation performance than polyimide. Thus, interposition of silicon oxide between the end portion of the n-side electrode 16 and the end portion of the p-side electrode 17 ensures prevention of short circuit between the n-side electrode 16 and the p-side electrode 17, achieving high reliability. Here, silicon oxide and polyimide are both transparent to the light emitted by the light-emitting layer in this embodiment.

An n-side interconnect 41 and a p-side interconnect 42 separated from each other are formed on the surface of the insulating film 22 opposite to its surface in contact with the n-side electrode 16 and the p-side electrode 17. The n-side interconnect 41 is provided also in an opening 23 which is formed in the insulating film 22 so as to reach the n-side electrode 16, and the n-side interconnect 41 is electrically connected to the n-side electrode 16. The p-side interconnect 42 is provided also in an opening 24 which is formed in the insulating film 22 so as to reach the p-side electrode 17, and the p-side interconnect 42 is electrically connected to the p-side electrode 17. For instance, the n-side interconnect 41 and the p-side interconnect 42 are formed by electrolytic plating in which a seed metal 40 formed on the surface of the insulating film 22 and the inner wall of the openings 23, 24 is used as a current path.

The n-side electrode 16, the p-side electrode 17, the n-side interconnect 41, the p-side interconnect 42, and the insulating film 22 are all provided on the opposite side of the light extraction surface 12 in the light-emitting element 15 and constitute the interconnect layer. This interconnect layer is collectively formed in wafer state as described later.

The semiconductor light-emitting device shown in FIG. 1 is a singulated one diced from wafer state. The portion of the first semiconductor layer 13 where the second semiconductor layer 14 is not provided is divided by a first isolation trench 31 and a second isolation trench 32 in wafer state. The first isolation trench 31 functions as a scribe line, and singulation is performed by dicing along the first isolation trench 31.

The second isolation trench 32 is formed in the end portion of the first semiconductor layer 13 near the first isolation trench 31. The second isolation trench 32 is formed inside a region surrounded by the first isolation trench 31 serving as a scribe line. A light-blocking member 35 opaque to the light emitted by the light-emitting layer is provided in the second isolation trench 32. The light-blocking member 35 is made of the same metal material as the n-side interconnect 41 and the p-side interconnect 42. The seed metal 40 is formed also in the second isolation trench 32, and the metal constituting the light-blocking member 35 is also simultaneously formed during electrolytic plating for forming the n-side interconnect 41 and the p-side interconnect 42. Here, the seed metal 40 formed in the second isolation trench 32 also functions as a light-blocking member.

The metal constituting the light-blocking member 35 (including the seed metal 40) is separated and electrically disconnected from the p-side interconnect 42. The light-blocking member 35 may or may not be connected to the n-side interconnect 41. If the light-blocking member 35 is connected to the n-side interconnect 41, the light-blocking member 35 also functions as an n-side interconnect 41 for supplying a current to the first semiconductor layer 13. That is, a current can be supplied to the first semiconductor layer 13 through the n-side electrode 16, which is connected to the light-blocking member 35 in the sidewall of the second isolation trench 32.

Figure 2A:
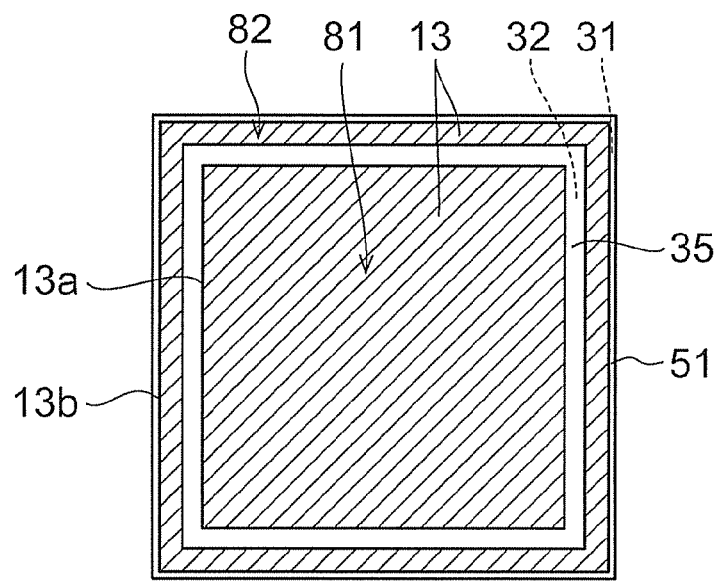
FIGS. 2A and 2B are schematic views showing a planar layout of components of the semiconductor light-emitting device.

FIG. 2A shows a planar layout of the second isolation trench 32. The first semiconductor layer 13 is divided by the second isolation trench 32 into a light-emitting region 81 and a non-light-emitting region 82 outside it. In the light-emitting region 81, the n-side electrode 16 is connected to the n-side interconnect 41, the p-side electrode 17 is connected to the p-side interconnect 42, and a current is supplied therethrough to the light-emitting element 15. Thus, the light-emitting region 81 emits light. The non-light-emitting region 82 is the first semiconductor layer 13 remaining like a frame between the first isolation trench 31 and the second isolation trench 32. The non-light-emitting region 82 does not include the second semiconductor layer 14 including the light-emitting layer, nor is connected to the n-side interconnect 41 and the p-side interconnect 42. Thus, the non-light-emitting region 82 does not emit light.

The second isolation trench 32 surrounds the light-emitting region 81 like a frame. The light-blocking member 35 is provided in the second isolation trench 32, and the side surface 13a of the light-emitting region 81 adjacent to the second isolation trench 32 is surrounded and covered with the light-blocking member 35.

Referring again to FIG. 1, an n-side metal pillar 43 is provided below the n-side interconnect 41. A p-side metal pillar 44 is provided below the p-side interconnect 42. The periphery of the n-side metal pillar 43, the periphery of the p-side metal pillar 44, the n-side interconnect 41, the p-side interconnect 42, and the light-blocking member 35 are covered with a sealing resin 51.

Furthermore, a part of the sealing resin 51 is filled also in the first isolation trench 31. The sealing resin 51 in the first isolation trench 31 covers the end surface 13b of the first semiconductor layer 13 adjacent to the first isolation trench 31. Furthermore, as shown in FIG. 2A, the sealing resin 51 in the first isolation trench 31 surrounds the side surface 13a of the light-emitting region 81 from the outside of the light-blocking member 35 provided in the second isolation trench 32. The sealing resin 51 is a resin containing a pigment component such as carbon black, and is opaque to the light emitted by the light-emitting layer. Hence, the sealing resin 51 in the first isolation trench 31 also functions as a light-blocking member. Thus, the side surface 13a of the light-emitting region 81 is doubly surrounded by light-blocking members.

The first semiconductor layer 13 is electrically connected to the n-side metal pillar 43 through the n-side electrode 16 and the n-side interconnect 41. The second semiconductor layer 14 is electrically connected to the p-side metal pillar 44 through the p-side electrode 17 and the p-side interconnect 42. External terminals such as solder balls and metal bumps, not shown, are formed on the lower end surface of the n-side metal pillar 43 and the p-side metal pillar 44 exposed from the sealing resin 51, and the interconnect layer and the light-emitting element 15 described above can be connected to external circuits through the external terminals.

In the structure of this embodiment, even if the light-emitting element 15 (the multilayer body of the first semiconductor layer 13 and the second semiconductor layer 14) is thin, its mechanical strength can be maintained by thickening the n-side metal pillar 43, the p-side metal pillar 44, and the sealing resin 51. Furthermore, the n-side metal pillar 43 and the p-side metal pillar 44 can absorb and relax the stress applied to the light-emitting element 15 through the external terminals when the device is mounted on a circuit board or the like. Preferably, the sealing resin 51 serving to support the n-side metal pillar 43 and the p-side metal pillar 44 has a thermal expansion coefficient which is equal or close to that of the circuit board and the like. Examples of such a sealing resin 51 include epoxy resin, silicone resin, and fluororesin.

The n-side interconnect 41, the p-side interconnect 42, the n-side metal pillar 43, the p-side metal pillar 44, and the light-blocking member 35 can be made of such a material as copper, gold, nickel, and silver. Among them, it is more preferable to use copper, which has good thermal conductivity, high migration resistance, and superior contact with the insulating films 21 and 22.

In the light-emitting element 15, on the light extraction surface 12 opposite to the second major surface with the interconnect layer provided thereon, a phosphor layer 61 is provided opposite to the light extraction surface 12. The phosphor layer 61 can absorb the light from the light-emitting layer and emit wavelength-converted light. Thus, it is possible to emit mixed light of the light from the light-emitting layer and the wavelength-converted light of the phosphor layer 61. For instance, for a nitride light-emitting layer, a white color, incandescent color and the like can be obtained as a mixed color of blue light from the light-emitting layer and yellow light, for instance, which is the wavelength-converted light of a yellow phosphor layer 61.

According to the embodiment of the invention, the side surface 13a of the portion of the first semiconductor layer 13 functioning as a light-emitting region is covered with the light-blocking member 35. This can prevent leakage light from the side surface 13a from being emitted outside without passing through the phosphor layer 61, or by passing therethrough only slightly. Consequently, white light with a desired tint can be extracted outside.

Furthermore, the light-blocking member 35 is metallic, and reflective to the light emitted by the light-emitting layer. Hence, the light emitted by the light-emitting layer and traveling in the first semiconductor layer 13 toward the side surface 13a can be reflected by the light-blocking member 35 and caused to travel toward the light extraction surface 12 on which the phosphor layer 61 is provided. This serves to suppress decrease in brightness.

The side surface of the second semiconductor layer 14 is covered with the insulating film 21, which is illustratively a silicon oxide film and transparent to the light emitted by the light-emitting layer. However, the light-blocking member 35 is provided also at the position opposed to the side surface of the second semiconductor layer 14 and surrounds the side surface of the second semiconductor layer 14. Further outside it, the sealing resin 51 opaque to the light emitted by the light-emitting layer is provided. Hence, no light leaks outside from the side surface of the second semiconductor layer 14.

Next, a method for manufacturing a semiconductor light-emitting device according to this embodiment is described with reference to FIGS. 3A to 6C.

Figure 3A:
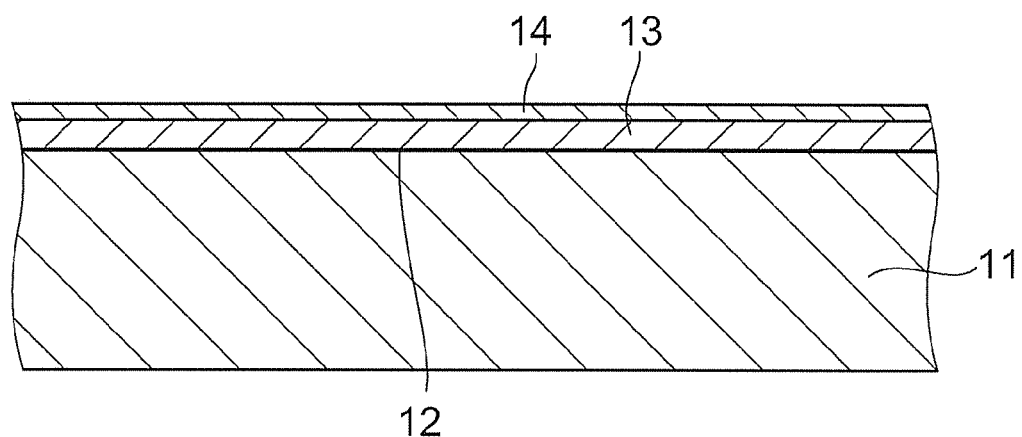
FIGS. 3A to 6C are schematic cross-sectional views showing a method for manufacturing the semiconductor light-emitting device.
Figure 3B:
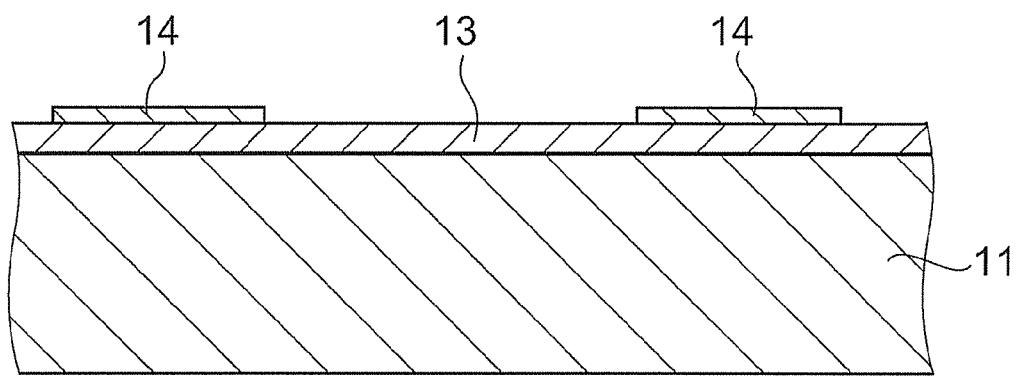

First, as shown in FIG. 3A, a first semiconductor layer 13 is formed on the major surface of a substrate 11, and a second semiconductor layer 14 is formed thereon. The surface of the first semiconductor layer 13 in contact with the major surface of the substrate 11 serves as a light extraction surface 12. For instance, in the case where the light-emitting layer is made of a nitride semiconductor, the first semiconductor layer 13 and the second semiconductor layer 14 can be crystal grown on a sapphire substrate. Subsequently, a resist mask, not shown, is used to pattern the second semiconductor layer 14, which is selectively left on the first semiconductor layer 13 as shown in FIG. 3B.

Figure 3C:
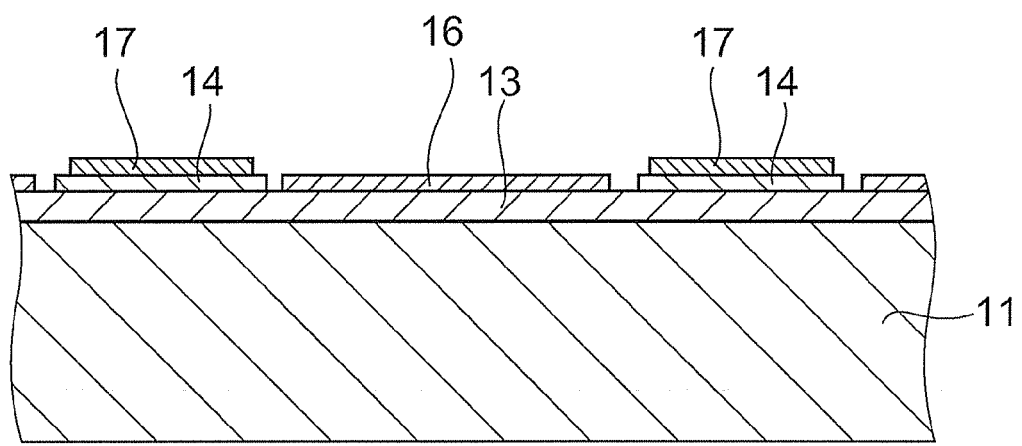

Next, as shown in FIG. 3C, a p-side electrode 17 is formed on the second semiconductor layer 14, and an n-side electrode 16 is formed on a portion of the first semiconductor layer 13 where the second semiconductor layer 14 does not exist.

Figure 4A:
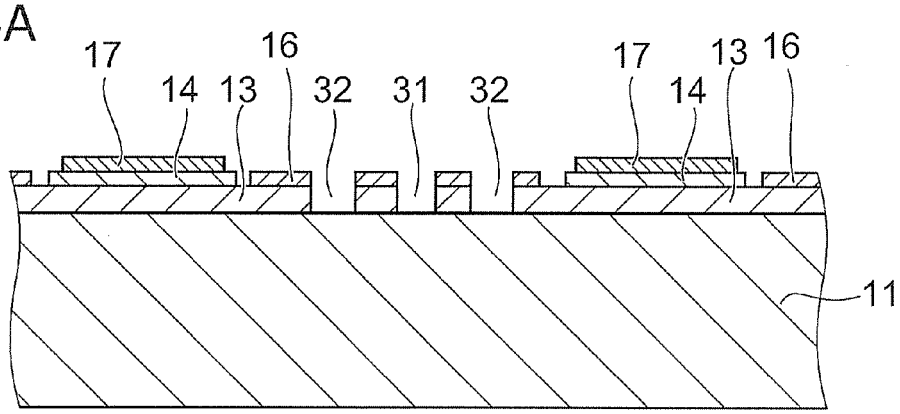

Next, as shown in FIG. 4A, a first isolation trench 31 and a second isolation trench 32 penetrating through the n-side electrode 16 and the first semiconductor layer 13 to the major surface of the substrate 11 are formed between the second semiconductor layers 14. The first isolation trench 31 and the second isolation trench 32 are formed illustratively by an RIE (reactive ion etching) process using a mask, not shown. Alternatively, the first isolation trench 31 and the second isolation trench 32 may be formed by laser ablation.

Figure 2B:
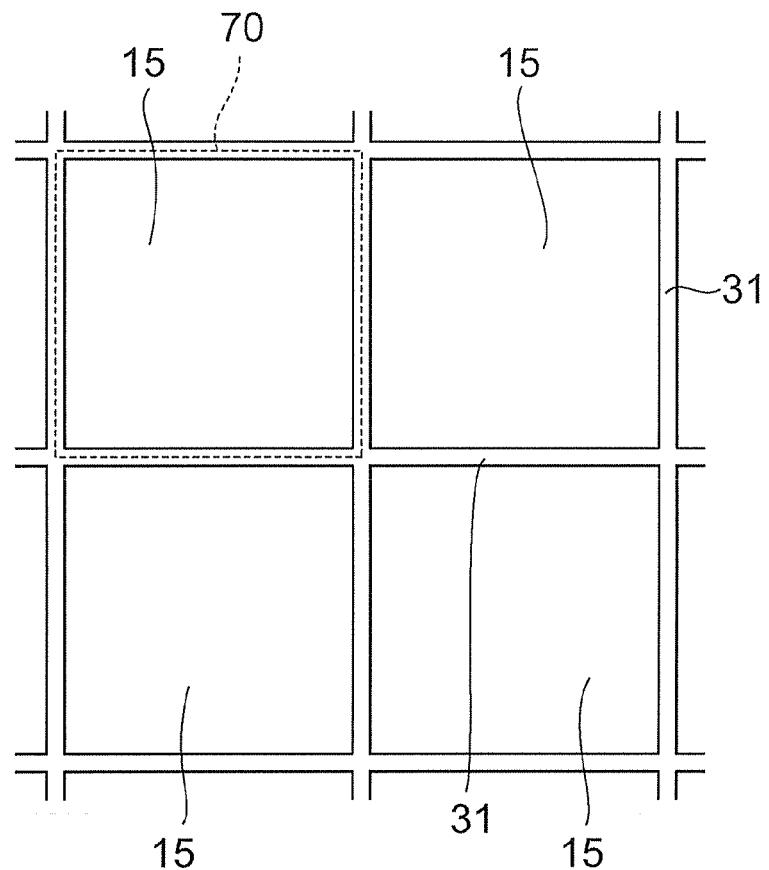

These first isolation trench 31 and second isolation trench 32 divide the first semiconductor layer 13 into a plurality on the major surface of the substrate 11. The first isolation trench 31 is formed illustratively like a lattice as shown in FIG. 2B. As described above with reference to FIG. 2A, the second isolation trench 32 is formed like a frame inside the first isolation trench 31, and the portion inside the second isolation trench 32 serves as a light-emitting region 81.

Figure 4B:
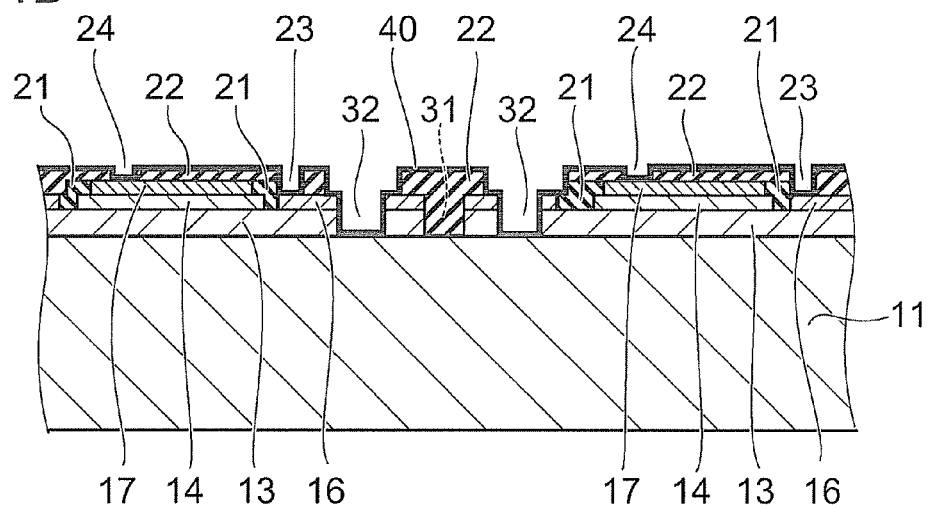

Next, as shown in FIG. 4B, an insulating film 21 is formed between the end portion of the p-side electrode 17 and the end portion of the n-side electrode 16, and an insulating film 22 covering the p-side electrode 17 and the n-side electrode 16 is further formed. The insulating film 22 is provided also in the first isolation trench 31 and the second isolation trench 32. Subsequently, an opening 24 reaching the p-side electrode 17 and an opening 23 reaching the n-side electrode 16 are formed in the insulating film 22. Furthermore, the insulating film 22 in the second isolation trench 32 is removed. The first isolation trench 31 remains filled with the insulating film 22.

Next, a seed metal 40 is formed entirely on exposed portions, such as the upper surface of the insulating film 22, the inner wall of the openings 23, 24, and the inner wall of the second isolation trench 32. Subsequently, a plating resist, not shown, is formed, and then electrolytic plating is performed using the seed metal 40 as a current path.

Figure 4C:
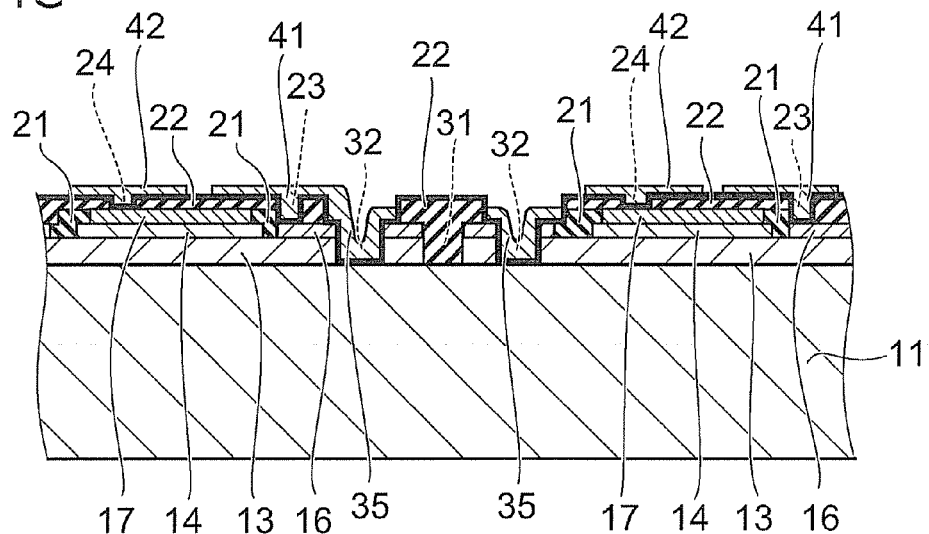

Thus, as shown in FIG. 4C, a p-side interconnect 42 connected to the p-side electrode 17 is formed in the opening 24 and on the insulating film 22 therearound, and an n-side interconnect 41 connected to the n-side electrode 16 is formed in the opening 23 and on the insulating film 22 therearound. Furthermore, a light-blocking member 35 is formed in the second isolation trench 32.

Figure 5A:
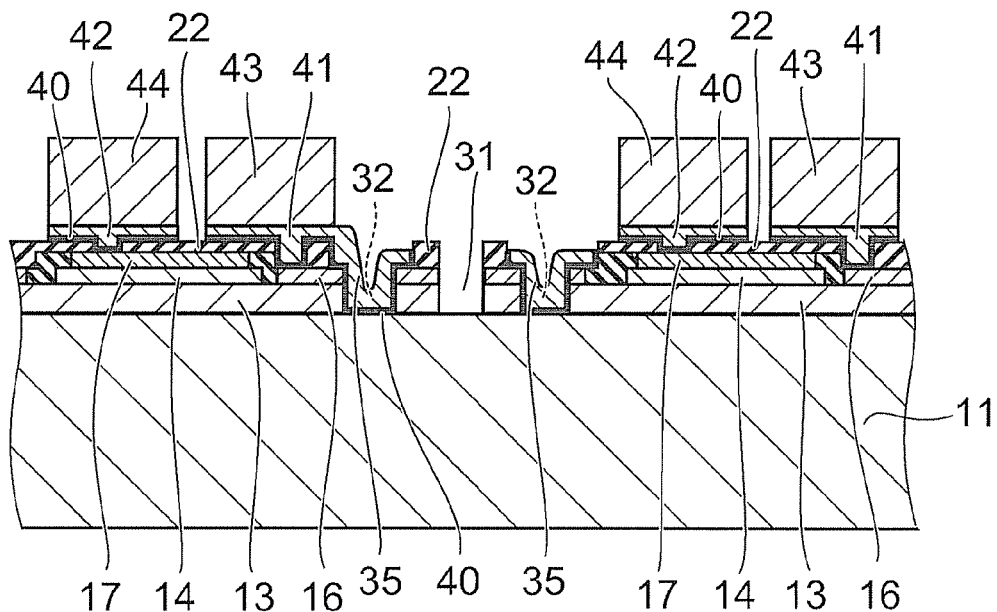

Next, a plating resist, not shown, is formed, and then electrolytic plating is performed using the seed metal 40 as a current path to form a p-side metal pillar 44 on the p-side interconnect 42 and an n-side metal pillar 43 on the n-side interconnect 41 as shown in FIG. 5A. Subsequently, the exposed portion of the seed metal 40 is removed to break the electrical connection through the seed metal 40 between the p-side interconnect 42 and the n-side interconnect 41 and break the electrical connection through the seed metal 40 between the p-side interconnect 42 and the light-blocking member 35.

Figure 5B:
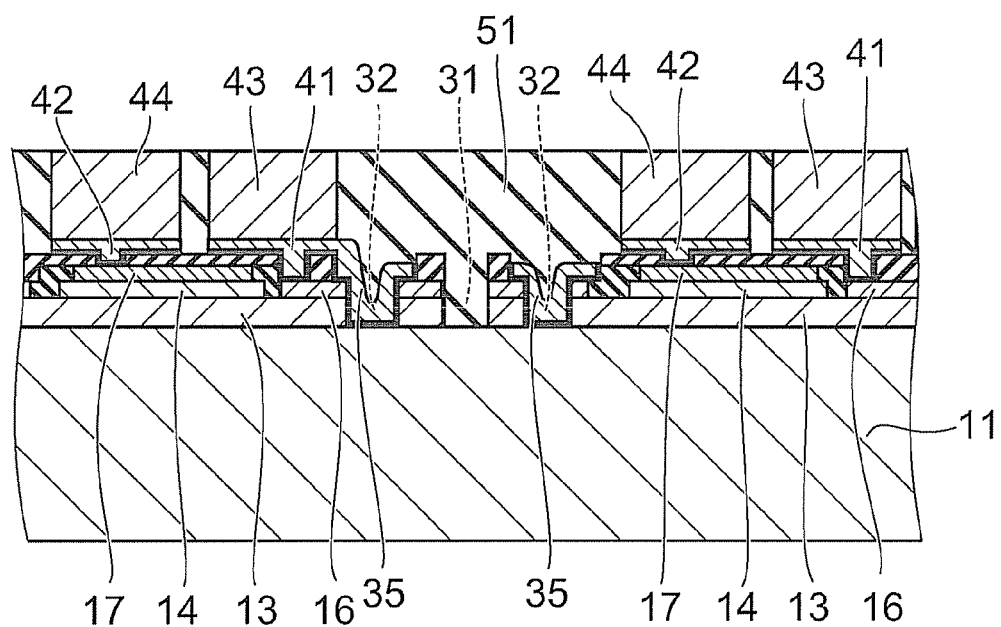

Next, after the insulating film 22 in the first isolation trench 31 is removed, the structure on the substrate 11 is covered with a sealing resin 51 as shown in FIG. 5B. The sealing resin 51 is filled between the p-side metal pillar 44 and the n-side metal pillar 43, and further filled on the light-blocking member 35 and in the first isolation trench 31.

Figure 6A:
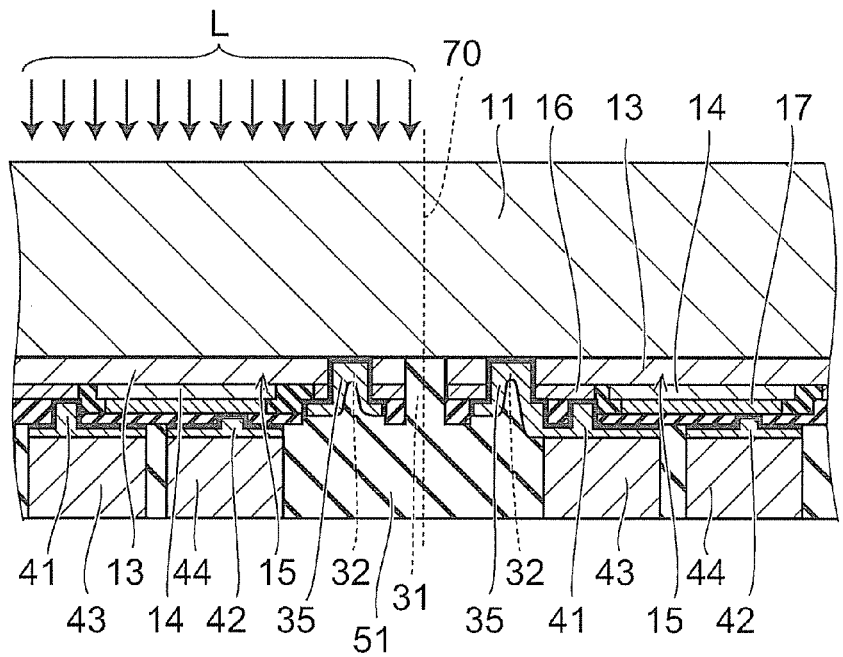
Figure 6B:
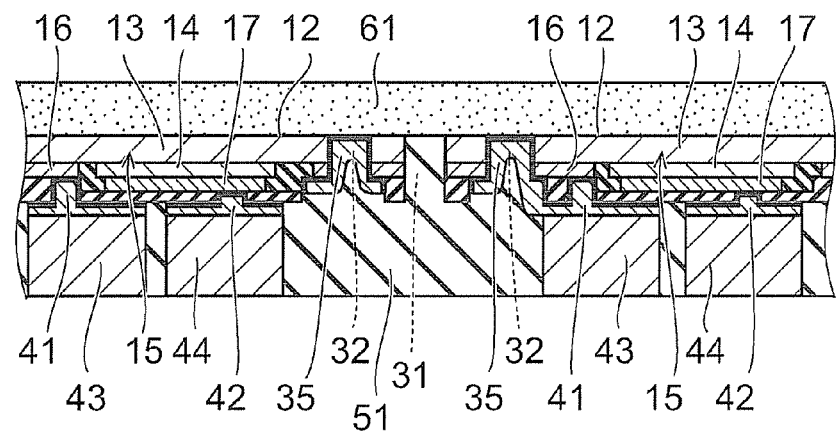
Figure 6C:
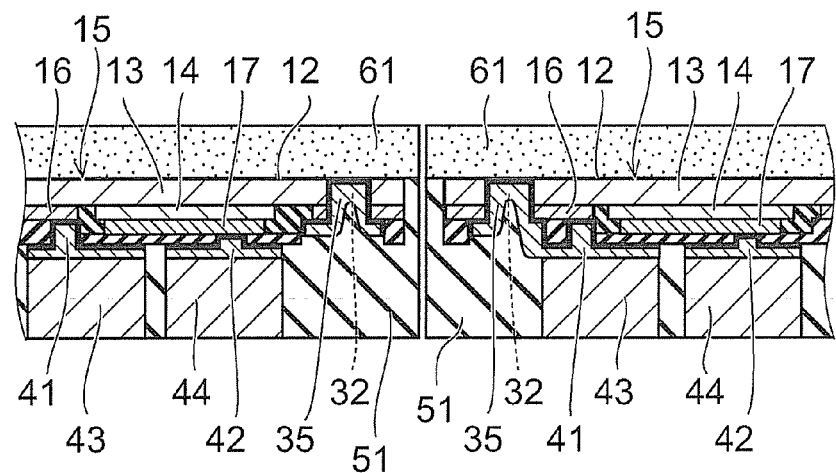

After the structure of FIG. 5B is obtained, the process of FIG. 6A is continued. In FIGS. 6A to 6C, the vertical positional relationship between the substrate 11 and the structure thereon is shown in reverse with respect to FIGS. 5A and 5B.

FIG. 6A shows the process for stripping the substrate 11 by laser lift-off. Laser light L is applied toward the first semiconductor layer 13 from the rear surface side of the substrate 11, which is opposite to its major surface on which the first semiconductor layer 13 is formed. The laser light L has a wavelength to which the substrate 11 is transmissive and which falls in an absorption region of the first semiconductor layer 13.

When the laser light L reaches the interface between the substrate 11 and the first semiconductor layer 13, the first semiconductor layer 13 near the interface is decomposed by absorbing the energy of the laser light L. For instance, in the case where the first semiconductor layer 13 is made of GaN, it is decomposed into Ga and nitrogen gas. Ga remains on the first semiconductor layer 13 side. This decomposition reaction forms a small gap between the substrate 11 and the first semiconductor layer 13, and the first semiconductor layer 13 and the substrate 11 are separated from each other.

Furthermore, the sealing resin 51 provided in the first isolation trench 31 and light-blocking member 35 provided in the second isolation trench 32 are also separated from the substrate 11 by receiving the energy of the laser light L.

Irradiation with the laser light L is performed multiple times on predefined regions across the wafer to strip the substrate 11. After the substrate 11 is stripped, a phosphor layer 61 is formed on the light extraction surface 12 as shown in FIG. 6B. The absence of the substrate 11 between the light extraction surface 12 and the phosphor layer 61 serves to increase the light extraction efficiency.

Subsequently, by dicing along the first isolation trench 31 serving as a scribe line, singulation from wafer state is performed as shown in FIG. 6C. The ways of dicing can illustratively be machine cutting using a diamond blade or the like, laser irradiation, or high-pressure water. Alternatively, splitting along the first isolation trench 31 by applying stress thereto is also possible. At the time of dicing, the substrate 11 has already been removed, which facilitates singulation.

The aforementioned processes up to dicing are each performed collectively in wafer state, which enables production at low cost. Furthermore, the package structure including the interconnect layer, the sealing resin 51, the metal pillars 43 and 44 and the like is formed in wafer level. This facilitates downsizing in which the overall planar size of the semiconductor light-emitting device is close to the planar size of the bare chip (light-emitting element 15).

Here, if the second isolation trench 32 is dug into the substrate 11, the light-blocking member (metal) 35 is dug into the substrate 11, which may interfere with separation between the light-blocking member 35 and the substrate 11 at the time of laser lift-off. Hence, in view of facilitating separation between the light-blocking member 35 and the substrate 11, preferably, the second isolation trench 32 only penetrates through the first semiconductor layer 13 without being formed in the substrate 11. Likewise, in view of facilitating separation in the first isolation trench 31 between the sealing resin 51 and the substrate 11, preferably, the first isolation trench 31 only penetrates through the first semiconductor layer 13 without being formed in the substrate 11.

Irradiation with the laser light L is performed illustratively for each light-emitting element 15. At this time, an edge 70 of the irradiation range of the laser light L is positioned in the first isolation trench 31. In FIGS. 6A and 2B, the edge 70 of the irradiation range of the laser light L is shown by a dashed line. The generally rectangular region inside the edge 70 is one shot of the laser light irradiation range.

The intensity of the laser light L tends to decrease at the edge 70 of the irradiation range of the laser light L than in the region inside it. Hence, preferably, the edge 70 of the irradiation range of the laser light L is positioned in a resin which is separated from the substrate 11 at lower energy than a metal. Thus, in this embodiment, the first isolation trench 31 is formed further outside the second isolation trench 32 with the light-blocking member 35 provided therein, and a sealing resin 51 is provided in the first isolation trench 31. By positioning the edge 70 of the irradiation range of the laser light L in this sealing resin 51 in the first isolation trench 31, the substrate 11 can be easily stripped even at the edge 70 where the intensity tends to decrease, and the manufacturability can be increased.

At the time of irradiation with the laser light L, vaporized gas is generated because the first semiconductor layer 13 is rapidly decomposed. At this time, the high-pressure gas may impact the light-emitting element 15 and cause cracking, crystal transition, fracture and the like. The gas generated by the decomposition of the first semiconductor layer 13 can diffuse in the planar direction through a gap formed between the substrate 11 and the first semiconductor layer 13. However, because the outside of the irradiation range of the laser light L is not laser-heated and remains in the solid phase, this solid-phase portion restricts the diffusion of the gas and tends to increase the gas pressure at the edge 70 of the irradiation range. Furthermore, a large stress is likely to act on the edge 70 of the irradiation range of the laser light L due to, for instance, the difference in energy, temperature, and phase between the irradiated portion and the non-irradiated portion of the laser light L. Hence, the light-emitting element 15 tends to be damaged particularly at the edge 70 of the irradiation range of the laser light L.

However, in this embodiment, as described above, irradiation with the laser light L is performed with the edge 70 of the irradiation range of the laser light L positioned in the first isolation trench 31. The semiconductor layers 13 and 14 do not exist in the first isolation trench 31, and thus damage to the semiconductor layers 13 and 14 can be prevented. Furthermore, a portion of the first semiconductor layer 13 adjacent to the first isolation trench 31 is a non-light-emitting region separated from the light-emitting region by the second isolation trench 32. Hence, damage to that portion, if any, does not affect the characteristics of the light-emitting element 15. Furthermore, the semiconductor layer 13 between the first isolation trench 31 and the second isolation trench 32 functions as a buffer layer against stress and impact during laser lift-off and dicing, and can relax the stress and impact applied to the light-emitting region. Here, the invention is not limited to leaving the semiconductor layer 13 between the first isolation trench 31 and the second isolation trench 32, but a void may be formed therebetween.

Figure 7A:
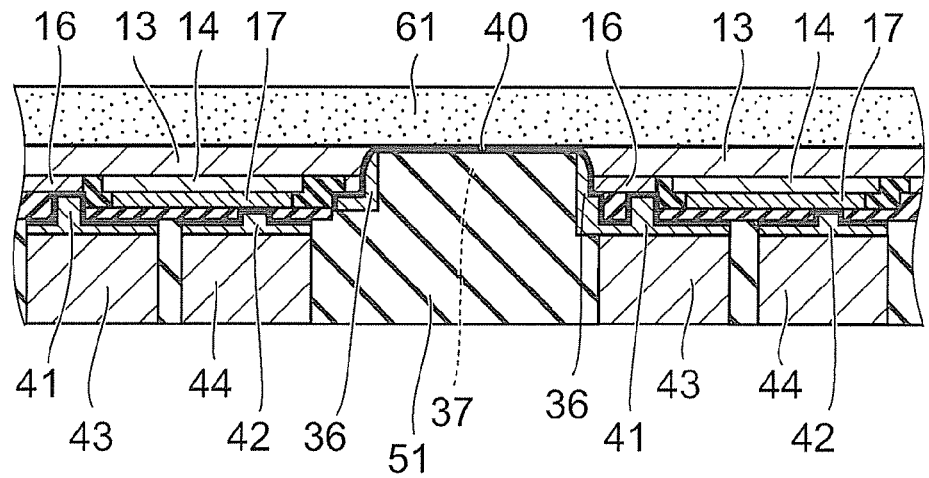
FIGS. 7A and 7B are schematic cross-sectional views showing a method for manufacturing a semiconductor light-emitting device according to a second embodiment.
Figure 7B:
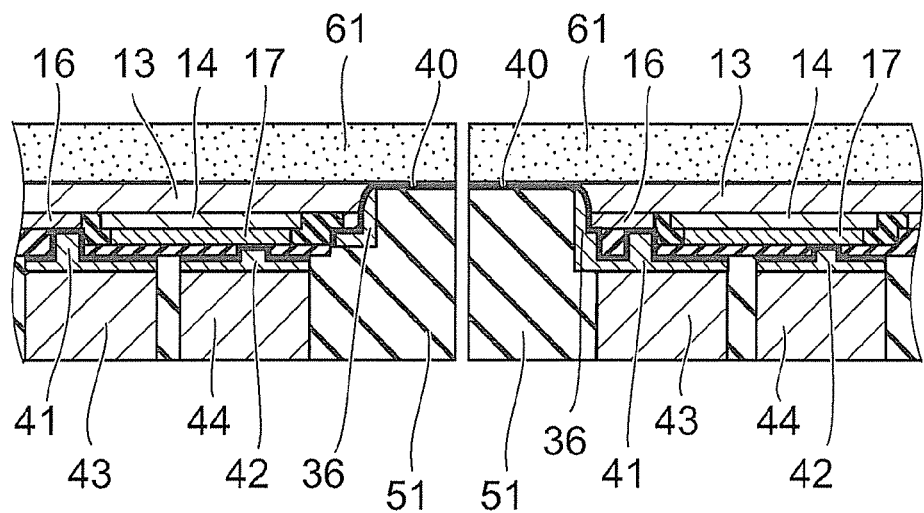

Alternatively, as in the structure of a second embodiment shown in FIGS. 7A and 7B, the sealing resin 51 may cover immediately outside a light-blocking member 36 made of a metal.

In this case, as shown in FIG. 7A, an isolation trench 37 for dividing the first semiconductor layer 13 in wafer state is formed. Subsequently, when an n-side interconnect 41 and a p-side interconnect 42 are formed by electrolytic plating using a seed metal 40 as a current path, metal is deposited also on the side surface of the first semiconductor layer 13 adjacent to the isolation trench 37 to form a light-blocking member 36. Subsequently, when a sealing resin 51 is formed, the sealing resin 51 is filled also in the isolation trench 37. Then, as shown in FIG. 7B, singulation is performed by dicing in the portion of the sealing resin 51 in the isolation trench 37.

Also in this embodiment, the side surface of the first semiconductor layer 13 and the second semiconductor layer 14 is covered with the light-blocking member 36, and the sealing resin 51 opaque to the light emitted by the light-emitting layer is provided also further outside it. This can prevent leakage light from the side surface of the first semiconductor layer 13 and the second semiconductor layer 14 from being emitted outside without passing through the phosphor layer 61, or by passing therethrough only slightly. Consequently, white light with a desired tint can be extracted outside.

Furthermore, at the time of laser lift-off, by positioning the edge of the irradiation range of laser light L in the sealing resin 51 in the isolation trench 37, the substrate 11 can be easily stripped even at the edge of the irradiation range of the laser light L where its intensity tends to decrease, and the manufacturability can be increased.

Furthermore, the sealing resin 51 covering the light-blocking member 36 functions as a buffer layer against stress and impact during laser lift-off and dicing, and can relax the stress and impact applied to the first semiconductor layer 13 and the second semiconductor layer 14.

Figure 8A:
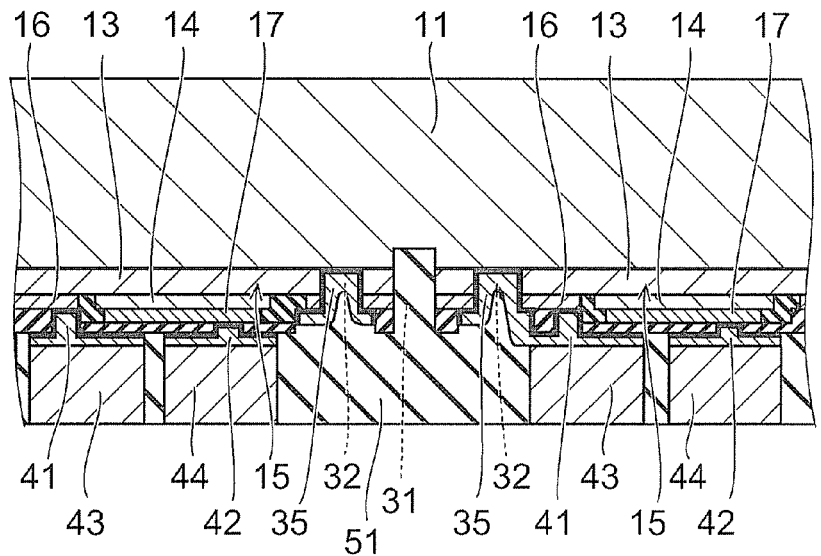
FIGS. 8A to 8C are schematic cross-sectional views showing a method for manufacturing a semiconductor light-emitting device according to a third embodiment.
Figure 8B:
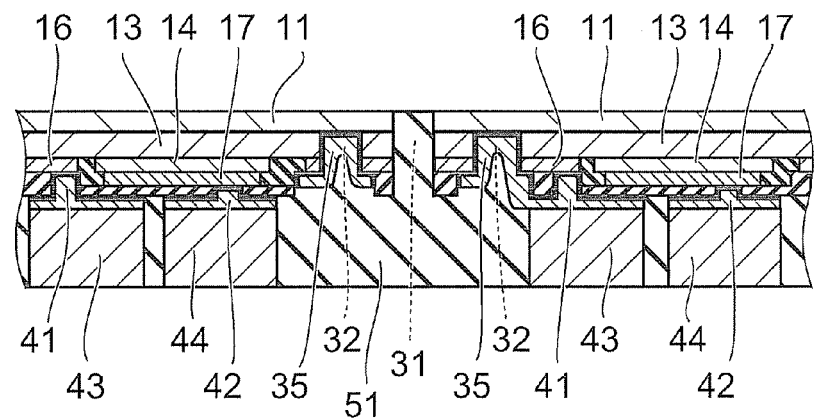

Next, a third embodiment of the invention is described with reference to FIGS. 8A to 8C.

In this embodiment, the substrate 11 is not completely removed, but ground and left thinly. Furthermore, in this embodiment, as shown in FIG. 8A, the first isolation trench 31 is dug into part of the substrate 11 on the major surface side.

After a sealing resin 51 is formed, the substrate 11 is ground from the rear surface side of the substrate 11. As shown in FIG. 8B, this grinding is performed until reaching the first isolation trench 31 formed on the major surface side of the substrate 11. The substrate 11 is left with approximately several tens μm, for instance.

Figure 8C:
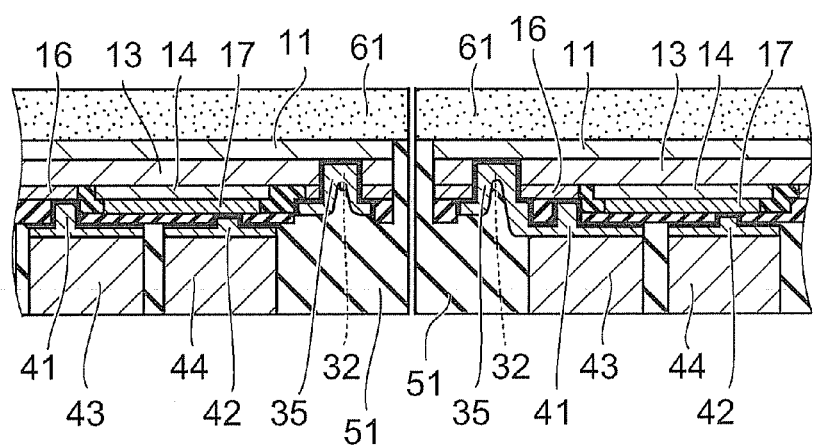

Subsequently, as shown in FIG. 8C, singulation is performed by dicing along the first isolation trench 31. In this embodiment, by thinning and leaving the substrate 11, it is possible to achieve higher mechanical strength, and hence a more reliable structure, than the structure in which the substrate 11 is completely removed. Furthermore, the remaining substrate 11 can prevent warpage after singulation, which facilitates mounting on a circuit board and the like.

The first isolation trench 31 is formed also into the major surface side of the substrate 11, and the rear surface of the substrate 11 is ground to the first isolation trench 31. Thus, as shown in FIG. 8B, the substrate 11 is divided by the first isolation trench 31. Hence, the portion devoid of the rigid substrate 11 is cut by dicing along the first isolation trench 31, which can increase productivity.

Figure 9A:
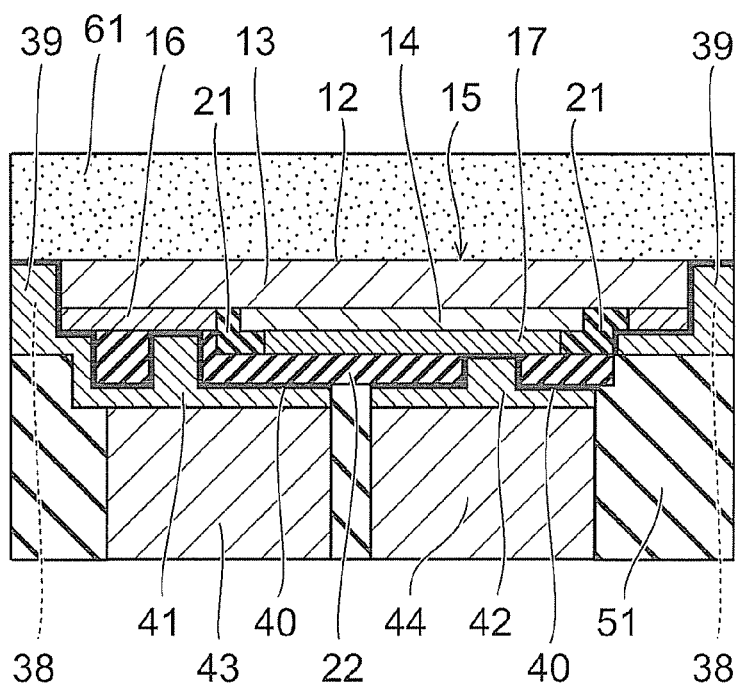
FIGS. 9A and 9B are schematic cross-sectional views of a semiconductor light-emitting device according to another embodiment.

As shown in the structure of FIG. 9A, the side surface of the first semiconductor layer may be covered with only a metal serving as a light-blocking member 39. In the structure of FIG. 9A, an isolation trench 38 for dividing the first semiconductor layer 13 in wafer state is formed. Then, during electrolytic plating for forming an n-side interconnect 41 and a p-side interconnect 42, metal is deposited also in the isolation trench 38 to form a light-blocking member 39 covering the side surface of the first semiconductor layer 13.

Thus, the side surface of the first semiconductor layer 13 is covered with a metal reflective to the light emitted by the light-emitting layer. Hence, the light emitted by the light-emitting layer and traveling in the first semiconductor layer 13 toward the side surface can be reflected by the light-blocking member 39 and caused to travel toward the light extraction surface 12 on which the phosphor layer 61 is provided. This serves to suppress decrease in brightness.

Figure 9B:
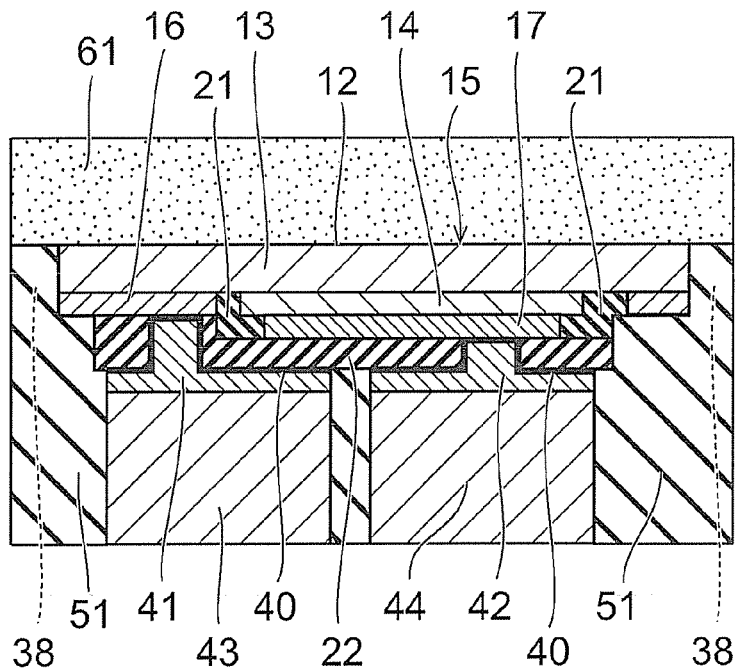

As an alternative structure, as shown in FIG. 9B, the side surface of the first semiconductor layer may be covered with only a sealing resin 51 serving as a light-blocking member. In the structure of FIG. 9B, an isolation trench 38 for dividing the first semiconductor layer 13 in wafer state is formed. Then, when the sealing resin 51 is formed, the sealing resin 51 is filled also in the isolation trench 38.

At the time of laser lift-off, by positioning the edge of the irradiation range of laser light L in the sealing resin 51 in the isolation trench 38, the substrate 11 can be easily stripped even at the edge of the irradiation range of the laser light L where its intensity tends to decrease, and the manufacturability can be increased.

The embodiments of the invention have been described with reference to examples. However, the invention is not limited thereto, but can be variously modified within the spirit of the invention. The material, size, shape, layout and the like of the substrate, light-emitting element, electrode, interconnect layer, metal pillar, insulating film, and sealing resin can be variously modified by those skilled in the art, and such modifications are also encompassed within the scope of the invention as long as they do not depart from the spirit of the invention.

The invention claimed is:

1. A semiconductor light-emitting device comprising:
a semiconductor layer including a light-emitting layer, the semiconductor layer having a first major surface and a second major surface opposite to the first major surface;
an n-side electrode and a p-side electrode provided on the semiconductor layer;
an n-side interconnect layer connected to the n-side electrode;
a p-side interconnect layer connected to the p-side electrode;
a resin provided in contact with the n-side interconnect layer and the p-side interconnect layer between the n-side interconnect layer and the p-side interconnect layer;
a light-blocking member provided outside the semiconductor layer; and
a phosphor layer provided on the first major surface side, a substrate for growth of the semiconductor layer not being interposed between the first major surface and the phosphor layer.

2. The device of claim 1, wherein the light-blocking member includes a metal.

3. The device of claim 1, wherein the light-blocking member includes a resin.

4. The device of claim 3, wherein the resin of the light-blocking member includes a carbon black.

5. The device of claim 1, wherein the light-blocking member is a metal, and a side surface of the metal is not exposed on an outside of the semiconductor light-emitting device.

6. The device of claim 1, wherein the resin provided between the n-side interconnect layer and the p-side interconnect layer is opaque to light emitted from the light-emitting layer.

7. The device of claim 1, wherein the n-side interconnect layer includes an n-side interconnect provided on the n-side electrode and an n-side metal pillar provided on the n-side interconnect, the p-side interconnect layer includes a p-side interconnect provided on the p-side electrode and a p-side metal pillar provided on the p-side interconnect.

8. The device of claim 7, wherein a part of the n-side interconnect extends to a side surface of the semiconductor layer as the light-blocking member.

9. The device of claim 7, wherein the n-side interconnect, the p-side interconnect, the n-side metal pillar and the p-side metal pillar contain a copper.

10. The device of claim 7, wherein the n-side metal pillar, the p-side metal pillar, and the resin provided between the n-side metal pillar and the p-side metal pillar are thicker than the semiconductor layer.

11. The device of claim 1, wherein the n-side interconnect layer and the p-side interconnect layer include a seed metal provided on the semiconductor layer side, and a part of the seed metal is provided as the light-blocking member.

12. The device of claim 1, wherein the resin covers around the n-side interconnect layer and the p-side interconnect layer.

13. The device of claim 12, wherein the resin is opaque to light emitted from the light-emitting layer, and the resin is provided as the light-blocking member.

14. The device of claim 1, further comprising external terminals provided on the n-side interconnect layer and the p-side interconnect layer.

15. The device of claim 14, wherein the external terminals are solder balls or metal bumps.

16. The device of claim 1, further comprising an insulating film provided on the n-side electrode and the p-side electrode, the insulating film having a first opening which reaches the n-side electrode and a second opening which reaches the p-side electrode, wherein the n-side interconnect layer is provided in the first opening, and the p-side interconnect layer is provided in the second opening.

17. The device of claim 1, wherein the phosphor layer has a third major surface facing to the first major surface, and the light-blocking member is provided below the third major surface of the phosphor layer.

18. The device of claim 1, wherein the resin provided between the n-side interconnect layer and the p-side interconnect layer is opaque to a light emitted by the light-emitting layer.

* * * * *